United States Patent
Ramachandran et al.

(10) Patent No.: US 7,231,193 B2
(45) Date of Patent: Jun. 12, 2007

(54) DIRECT CURRENT OFFSET CORRECTION SYSTEMS AND METHODS

(75) Inventors: Bala Ramachandran, Irvine, CA (US); John E. Vasa, Irvine, CA (US)

(73) Assignee: Skyworks Solutions, Inc., Irvine, CA (US)

(*) Notice: Subject to any disclaimer, the term of this patent is extended or adjusted under 35 U.S.C. 154(b) by 354 days.

(21) Appl. No.: 10/822,919

(22) Filed: Apr. 13, 2004

(65) Prior Publication Data

US 2005/0225388 A1 Oct. 13, 2005

(51) Int. Cl.
*H04B 1/00* (2006.01)
*H04B 1/10* (2006.01)

(52) U.S. Cl. ............... 455/130; 455/63.1; 455/266; 455/295; 455/296; 375/319

(58) Field of Classification Search ........... 455/63.1, 455/266, 29, 308–309, 295, 296, 395, 245.1–253.2, 455/324; 375/319
See application file for complete search history.

(56) References Cited

U.S. PATENT DOCUMENTS

| | | | |
|---|---|---|---|
| 6,356,217 B1* | 3/2002 | Tilley et al. | 341/118 |
| 6,560,447 B2* | 5/2003 | Rahman et al. | 455/232.1 |
| 6,756,924 B2* | 6/2004 | Lee et al. | 341/120 |
| 6,985,711 B2* | 1/2006 | Holenstein et al. | 455/312 |
| 2003/0157915 A1 | 8/2003 | Aktinson et al. | |
| 2004/0012439 A1* | 1/2004 | Chen et al. | 330/69 |
| 2004/0038649 A1* | 2/2004 | Lin et al. | 455/130 |
| 2004/0071238 A1* | 4/2004 | Khlat et al. | 375/346 |
| 2004/0085133 A1* | 5/2004 | Shigematsu | 330/295 |
| 2004/0146122 A1* | 7/2004 | Fague et al. | 375/326 |
| 2005/0239428 A1* | 10/2005 | Seendripu et al. | 455/280 |

* cited by examiner

*Primary Examiner*—Simon Nguyen
(74) *Attorney, Agent, or Firm*—Thomas, Kayden, Horstemeyer & Risley, LLP.

(57) ABSTRACT

A system and method for direct current offset correction are disclosed. One embodiment of the system includes a direct current offset correction circuitry having an adjustable bandwidth and control logic configured to effect a bandwidth change of the direct current offset correction circuitry to speed up warm-up and settling time of the direct current offset correction circuitry.

29 Claims, 8 Drawing Sheets

DIRECT CURRENT OFFSET CORRECTION SYSTEMS AND METHODS

BACKGROUND OF THE INVENTION

1. Field of the Invention

This invention relates generally to transceivers. More particularly, the invention relates to direct current correction in multi-mode transceiver systems.

2. Related Art

Trends in portable transceivers, such as cellular handsets, have progressed towards smaller form factors, high data rate capabilities, as well as a variety of features such as integrated cameras, music download abilities, and/or global roaming. Accordingly, multi-mode systems such as GSM (Global System for Mobile Communications), CDMA 2000 (Code Division Multiple Access), WCDMA (wide-band CDMA), among others include radio architectures that have evolved towards direct-conversion receivers, which often consume less board space and typically cost less than other types of receivers.

The classical challenges in the design of direct conversion receiver architectures are well-known and include issues centering around direct current (DC) offset. DC offset typically results from a signal applied at two inputs (differential input), and represents the difference in the common mode voltage between the two inputs. In direct conversion receivers, the signal from an associated antenna is directly down-converted to baseband (e.g., DC) and then amplified before further signal processing, thus providing significant gain at baseband. Due to this large gain, any DC offsets generated in the front-end of the receiver (e.g., due to local oscillator (LO) leakage, non-linearities, etc.) can potentially saturate the baseband section and hence corrupt the desired signal, which is typically much smaller in signal level than the unwanted DC signal. Several methods of DC offset cancellation have been developed to minimize DC offset in many types of receivers, including direct conversion receivers, yet these methods may cause significant degradation in signal quality and/or a significant reduction in portable transceiver standby times.

Therefore, it would be desirable to provide a portable transceiver that provides enhanced features without significant signal degradation and/or excessive power consumption.

SUMMARY

Embodiments of a system and method for direct current offset correction are disclosed. One embodiment of the system, among others, includes a direct current offset correction circuitry having an adjustable bandwidth and control logic configured to effect a bandwidth change of the direct current offset correction circuitry to speed up warm-up and/or settling time of the direct current offset correction circuitry.

Related methods of operation are also provided. Other systems, methods, features, and advantages of the invention will be or become apparent to one with skill in the art upon examination of the following figures and detailed description. It is intended that all such additional systems, methods, and features, and advantages be included within this description, be within the scope of the invention, and be protected by the accompanying claims.

BRIEF DESCRIPTION OF THE FIGURES

The invention can be better understood with reference to the following figures. The components in the drawings are not necessarily to scale, emphasis instead being placed upon clearly illustrating the principles of the present systems and methods. Moreover, in the drawings, like reference numerals designate corresponding parts throughout the several views.

DETAILED DESCRIPTION

Figure 1:
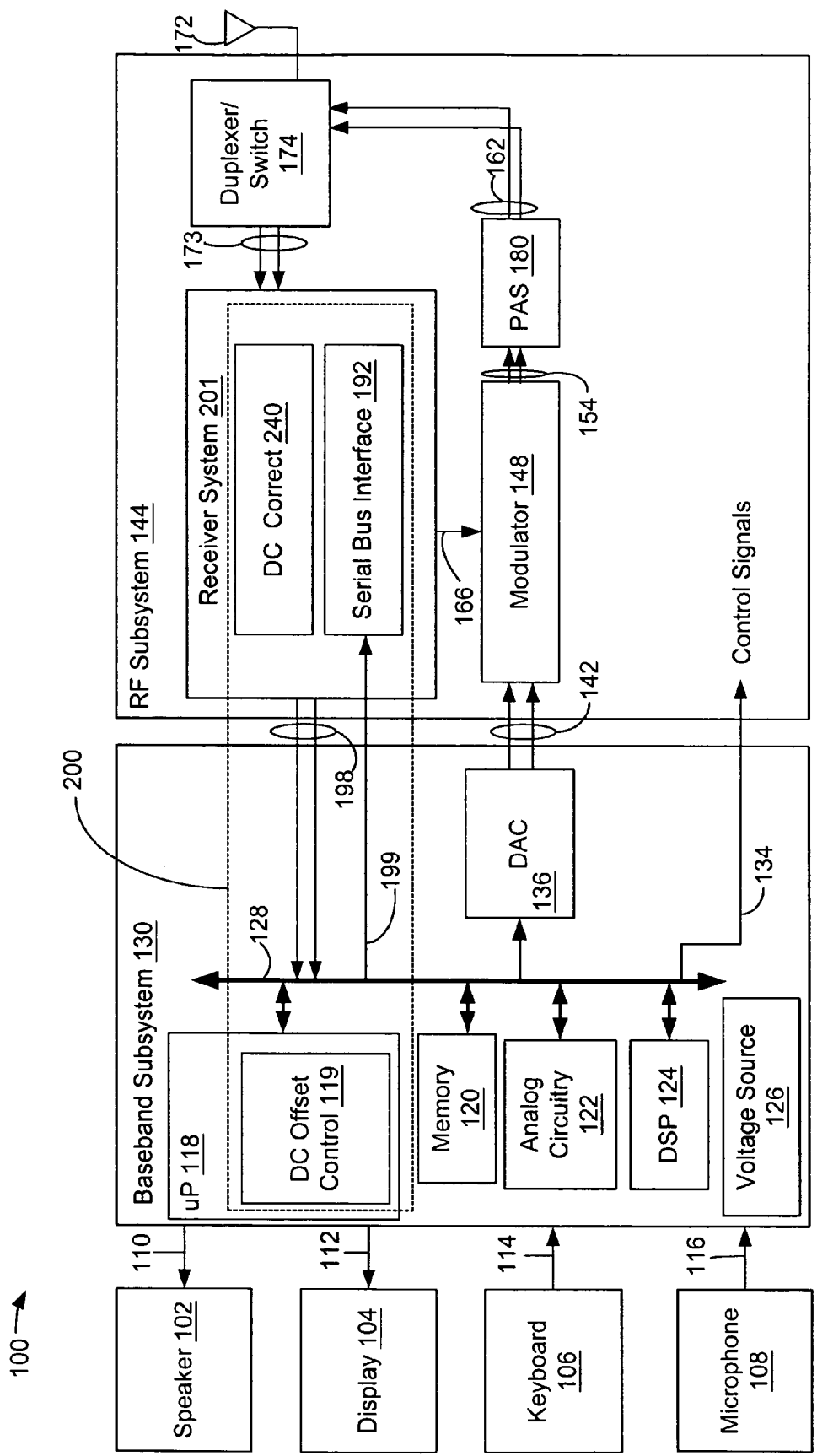
FIG. 1 is a block diagram that illustrates an exemplary portable transceiver in which various embodiments of a direct current (DC) offset correction system can be implemented.

Embodiments of a direct current (DC) offset correction system and method (herein, DC offset correction system for brevity) are disclosed. The DC offset correction system provides an efficient way of achieving a trade-off between DC offset cancellation and settling time, which can enable increased stand-by operation.

The DC offset correction system will be described in the context of a direct conversion receiver that can operate in WCDMA (wide-band Code Division Multiple Access), and GSM (Global System for Mobile Communications) systems, with the understanding that operation in other systems, such as CDMA 2000, is possible. In other words, the DC offset correction system is not constrained in scope to any particular receiver architecture, such as super heterodyne or direct conversion receivers. Generally-speaking, there is a significant build-up of gain along the receiver chain in proximity to DC, typically resulting in elevated DC offset values. Thus, direct conversion receiver implementations provide beneficial insight into the desirability of using the DC offset correction system. In systems like CDMA 2000 and WCDMA that use direct sequence spread spectrum, the bandwidth of the received signal information is approximately 630 kHz for CDMA 2000 and approximately 1.92 MHz for WCDMA. Such systems use a spreading sequence in the transmitter to spread the original data bandwidth to a wider bandwidth. This ratio of spreading is commonly referred to as processing gain. Because a spreading code is used, the signal bandwidth is generally much wider than DC. Therefore, when information at DC is removed, the portion removed represents a very small portion of the total bandwidth in terms of power spectral density. Thus, there is negligible degradation is signal quality when information at DC is removed when compared to, for example, narrowband systems. The DC offset correction system provides for adjustable bandwidths of receiver system componentry, the determination of which is a trade-off between settling time and the degradation in signal quality due to removing a portion of the signal energy at DC.

In one embodiment, the DC offset correction system provides for bandwidth switching of DC offset correction circuitry located in a receiver system of a portable transceiver when alternating between sleep and idle modes. The "sleep mode" refers to a condition where the receiver system is almost completely (e.g., majority of the components) powered off and there is minimal processing activity (e.g., enough to enable the receiver system to "wake-up" at the appropriate time to commence the idle mode). The radio frequency (RF) front end, mixed signal portions as well as the majority of RF subsystem base-band section functions are powered down to save power in the portable transceiver and subsequently increase battery life. The "idle mode" refers to a condition where the portable transceiver is demodulating the received signal and the receiver system is completely powered on. The portable transceiver alternates between sleep and idle modes to save power and receive information from a base station.

In another embodiment, the DC offset correction system switches the bandwidth of the DC offset correction circuitry when switching from a compressed mode of operation. "Compressed mode of operation" from WCDMA to GSM, for example, includes an operation where gaps are created in the WCDMA frames to enable the portable transceiver to make GSM measurements. Data is transmitted at a higher rate for a shorter period of time and a gap is then used to switch between WCDMA and GSM modes. When the portable transceiver returns to the WCDMA mode, the WCDMA receiver system is enabled and the various components have to settle before actual demodulation of data can begin. The components that undergo settling include DC offset correction circuitry of the receiver system, and the settling time of such components is inversely proportional to its respective bandwidth. A wider bandwidth implies a shorter settling time, and a narrower bandwidth implies a longer settling time. Therefore, when the WCDMA receiver chain is re-enabled, it is desirable to have the DC offset correction circuitry settle in the shortest time to minimize power drain as well as to reduce the warm-up time to enable settling.

Figure 2A:
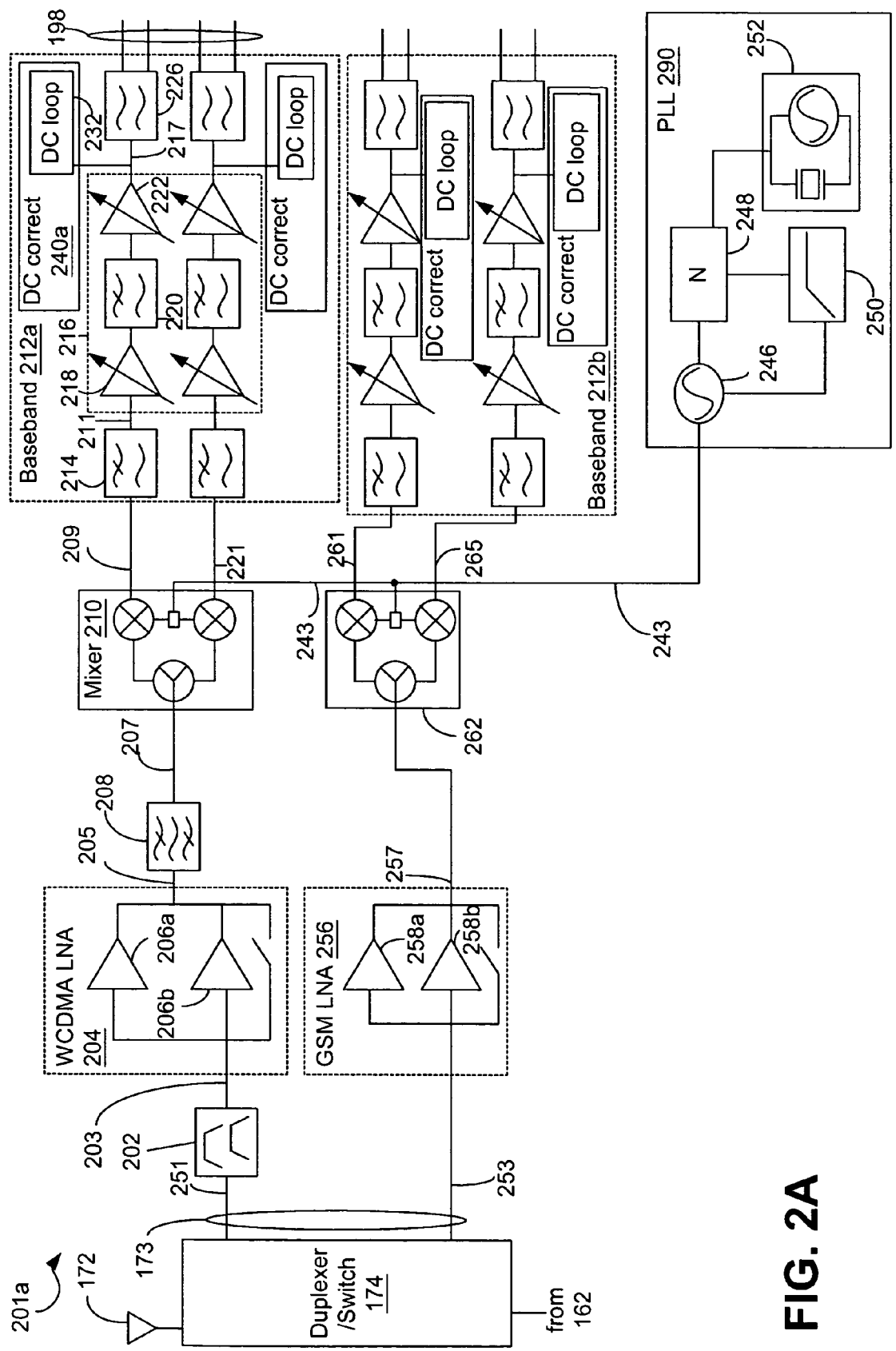
FIG. 2A is a block diagram that illustrates an embodiment of portions of the DC offset correction system for an example analog-baseband receiver of the portable transceiver shown in FIG. 1.
Figure 2B:
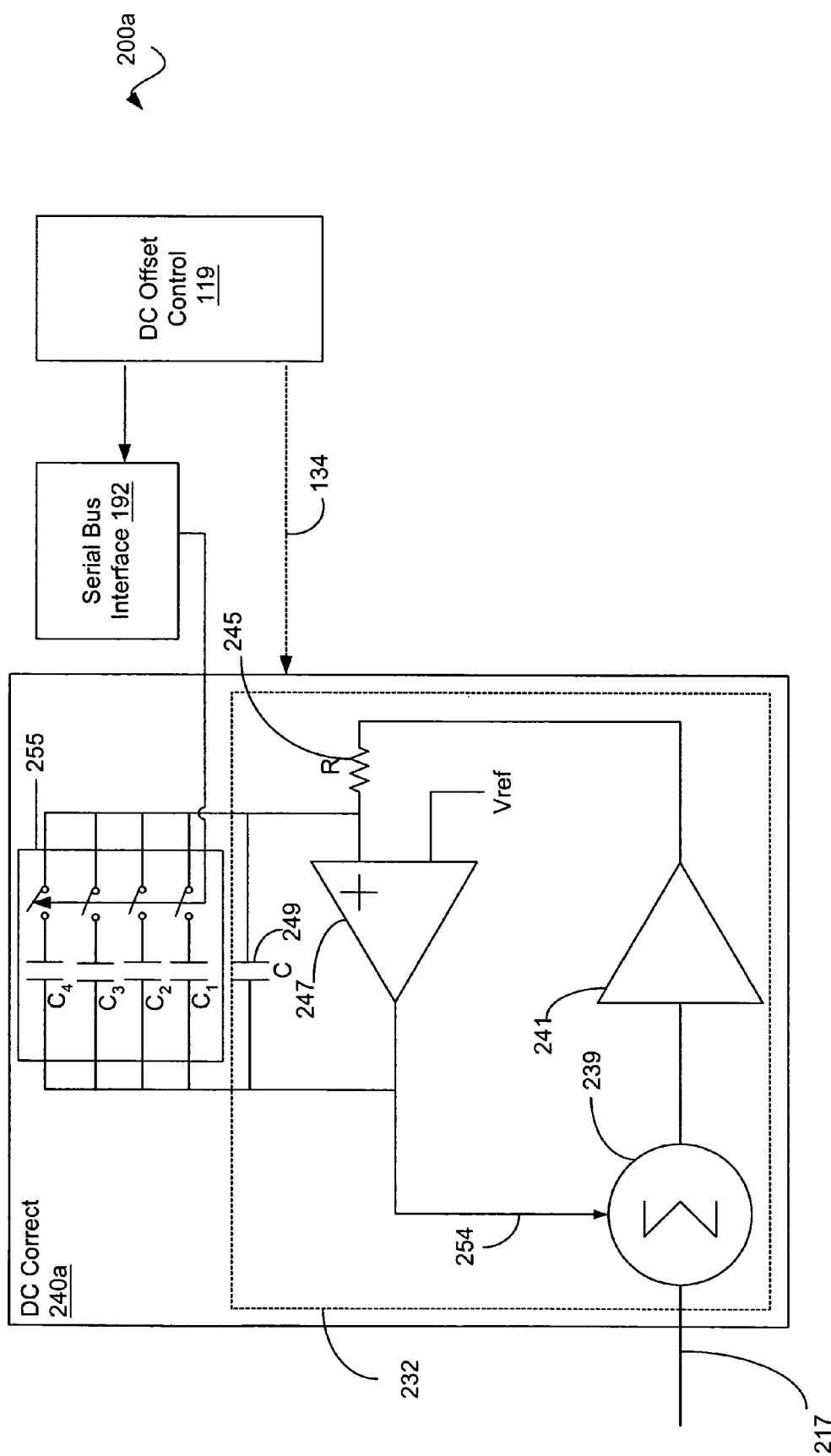
FIG. 2B is a schematic diagram that illustrates a DC offset correction system embodiment for operation with the analog-baseband receiver shown in FIG. 2A.
Figure 3A:
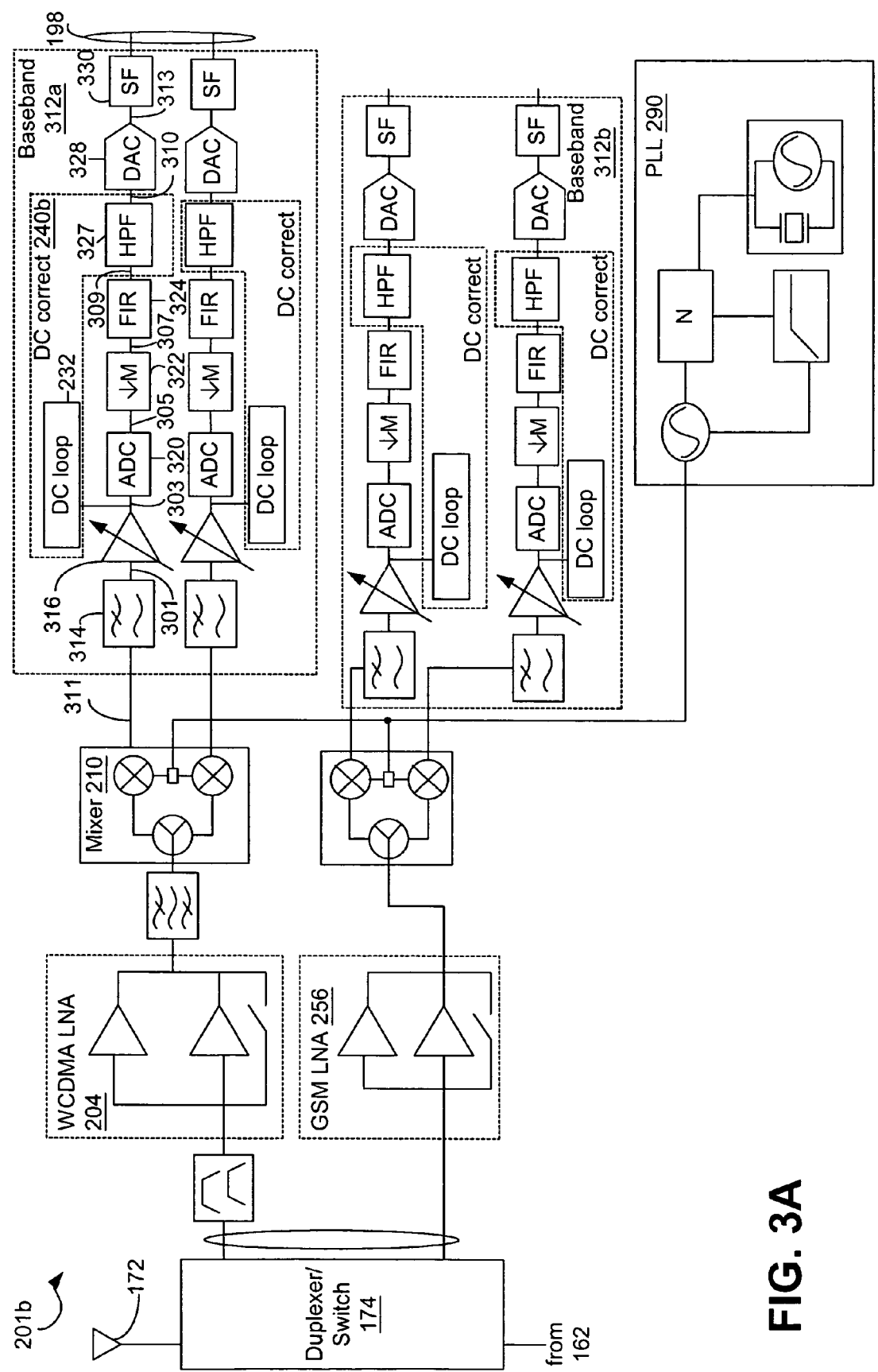
FIG. 3A is a block diagram that illustrates an embodiment of portions of the DC offset correction system for an example digital baseband receiver of the portable transceiver shown in FIG. 1.
Figure 3B:
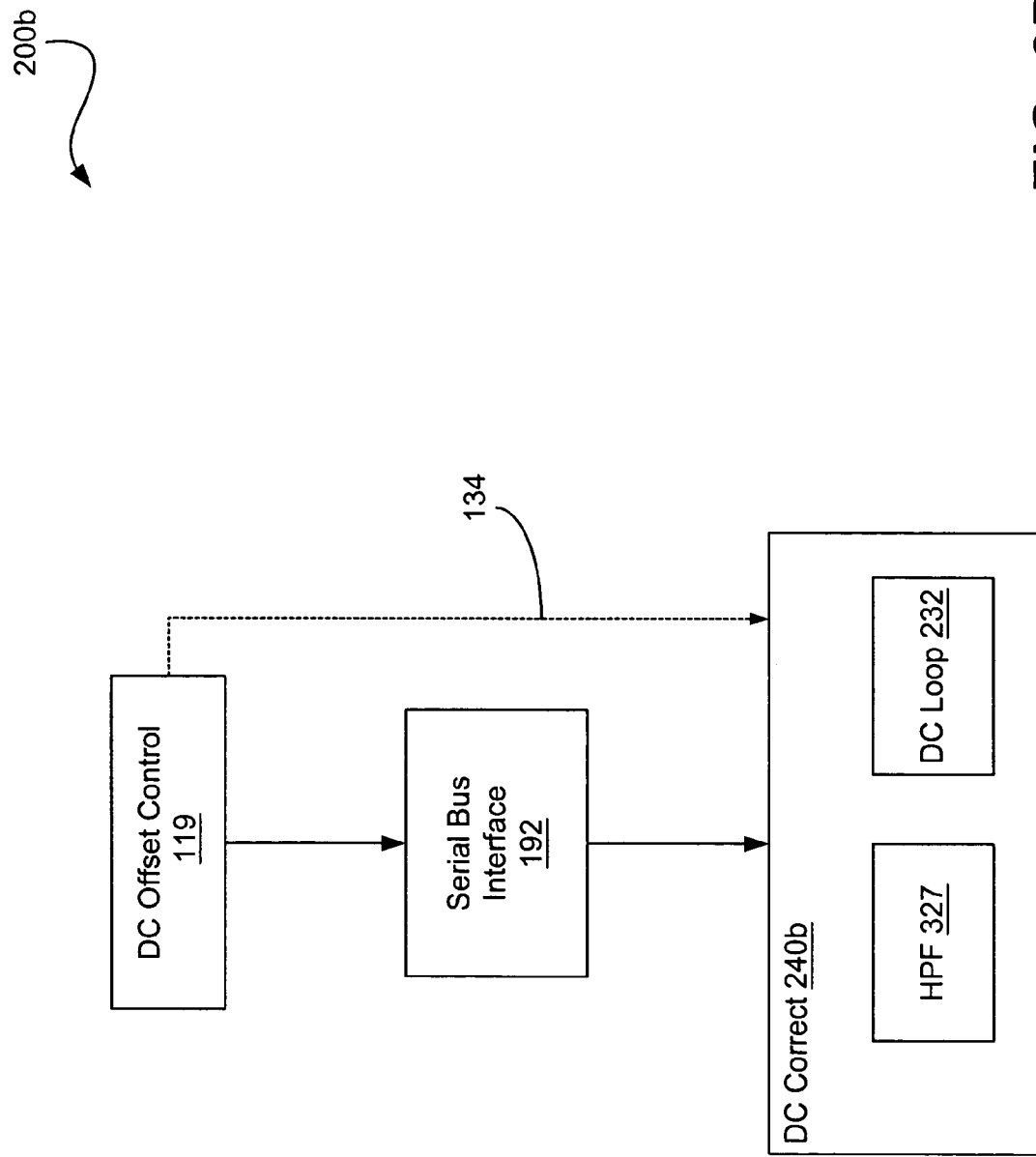
FIG. 3B is a block diagram that illustrates a DC offset correction system embodiment for operation with the digital baseband receiver shown in FIG. 3A.
Figure 4:
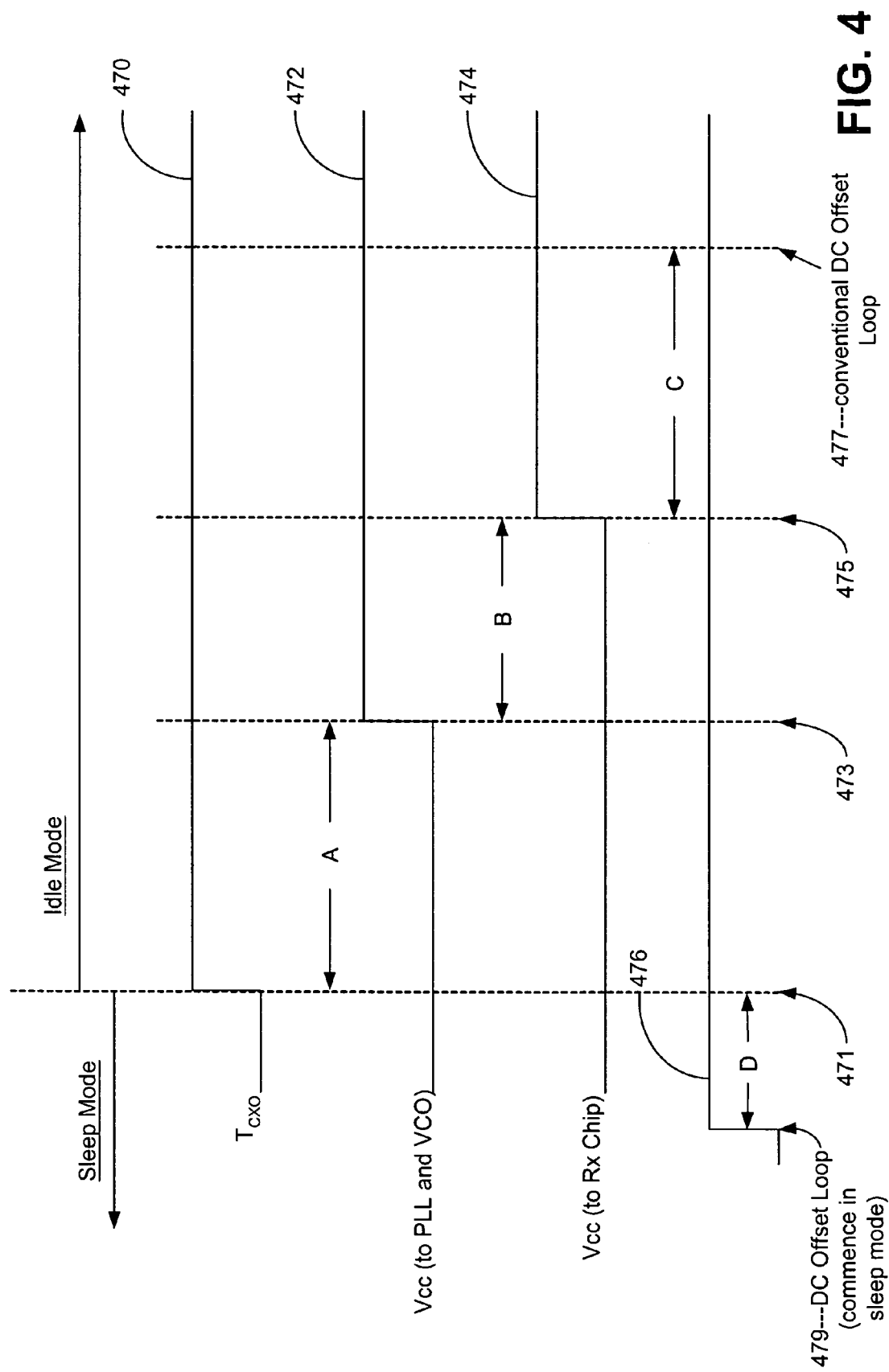
FIG. 4 is a schematic diagram that illustrates an example timing sequence for a sleep-to-idle mode warm-up and settling period acted upon by the DC offset correction system embodiments shown in FIGS. 2B and 3B.
Figure 5:
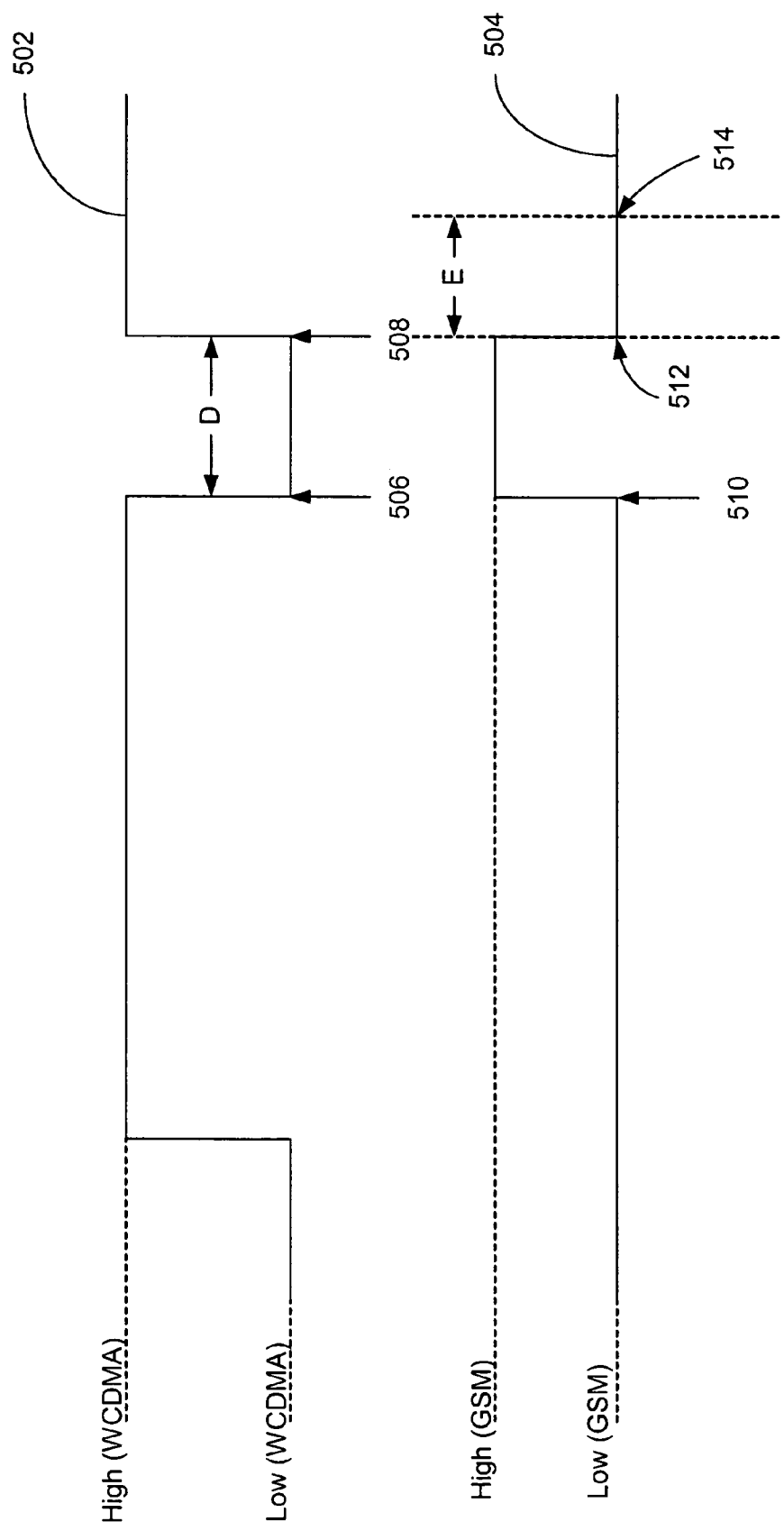
FIG. 5 is a schematic diagram that illustrates an example timing sequence for a change-over from a compressed mode of operation acted upon by the DC offset correction system embodiments shown in FIGS. 2B and 3B.
Figure 6:
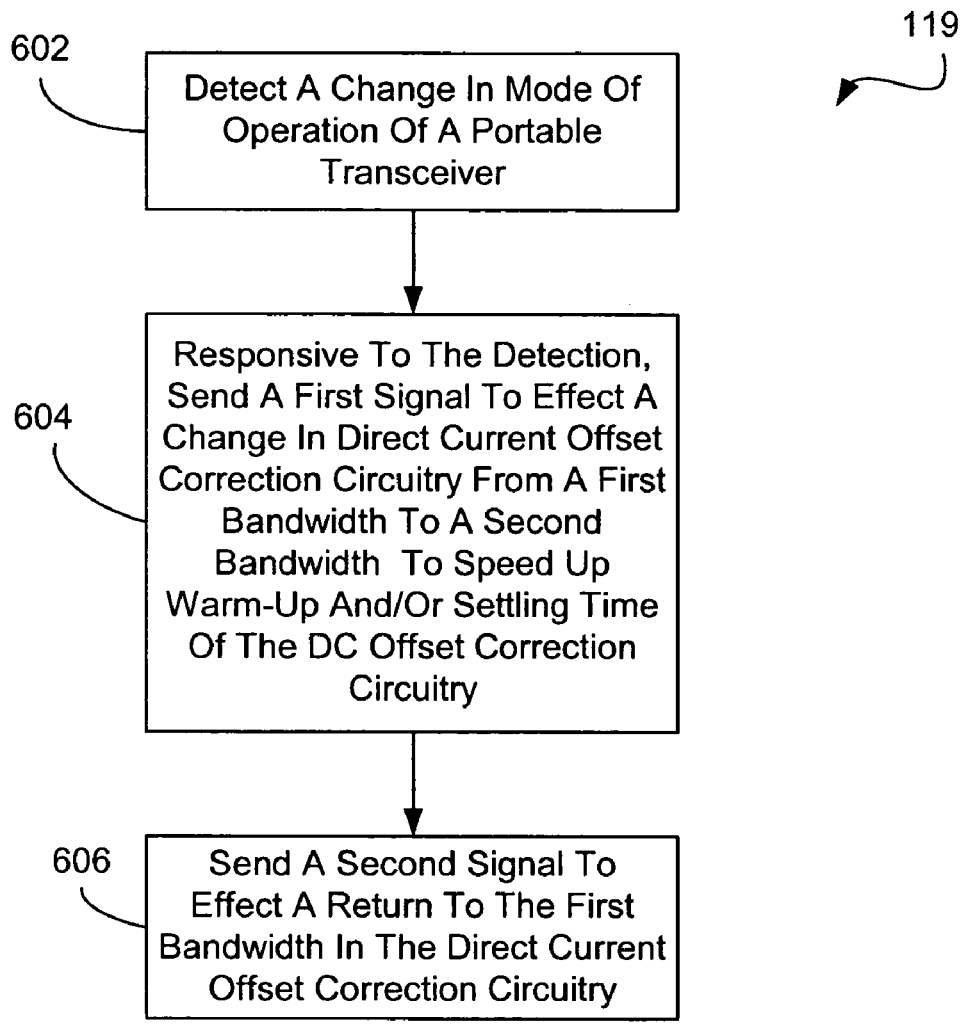
FIG. 6 is a flow diagram of an embodiment of an example method of operation employed by the DC offset correction control logic shown in FIG. 1.

To further explain the principles of operation of the DC offset correction system, an example transceiver will be shown in FIG. 1 to provide an exemplary implementation for the DC offset correction system embodiments. Some example direct-conversion receiver implementations for the DC offset correction system embodiments are shown in FIGS. 2A and 3A, and two DC offset correction system embodiments are shown in FIGS. 2B and 3B. FIGS. 4 and 5 illustrate sleep-to-idle mode bandwidth switching and compressed mode bandwidth switching as implemented by the DC offset correction system embodiments of FIGS. 2B and 3A. FIG. 6 illustrates methodology employed by DC offset correction control logic of the DC offset correction system.

FIG. 1 is a block diagram illustrating an example portable transceiver 100 in which various embodiments of a DC offset correction system 200 can be implemented. In one embodiment, the DC offset correction system 200 includes DC offset control logic 119, a serial bus interface 192, and DC offset correction circuitry 240, the components of which are described in further detail below. The portable transceiver 100 includes a speaker 102, display 104, keyboard 106, and microphone 108, all connected to a baseband subsystem 130. In a particular embodiment, the portable transceiver 100 can be, for example, a portable telecommunication device such as a mobile/cellular-type telephone. The speaker 102 and display 104 receive signals from the baseband subsystem 130 via connections 110 and 112, respectively. Similarly, the keyboard 106 and microphone 108 supply signals to the baseband subsystem 130 via connections 114 and 116, respectively.

The baseband subsystem 130 includes a microprocessor (μP) 118, memory 120, analog circuitry 122, and a digital signal processor (DSP) 124 in communication via bus 128. The microprocessor 118 is shown configured with the DC offset correction control logic 119, which, in one embodiment, may include embedded instructions that control the bandwidth adjustments of the DC offset correction circuitry 240. As described below, a change in mode of operation can be communicated to the DC offset correction control logic 119, which in turn, provides control signals to DC offset correction circuitry 240 to modify the bandwidth of the same. In some embodiments, functionality of the DC offset correction control logic 119 can be configured in other components of the portable transceiver 100, including the DSP 124 or memory 120, or in a radio frequency (RF) subsystem 144 as described below. Further, the DC offset correction logic 119 can be implemented using hardware, software, and/or a combination of hardware and software. The baseband subsystem 130 also includes, in one embodiment, a voltage source 126.

Bus 128, although shown as a single bus, may be implemented using multiple busses connected as necessary among the subsystems within the baseband subsystem 130. The microprocessor 118 and memory 120 provide signal timing, processing and storage functions for the portable transceiver 100. Analog circuitry 122 provides analog processing functions for the signals within the baseband subsystem 130. The baseband subsystem 130 provides control signals to the RF subsystem 144 via connection 134, and/or over connection 199. Although each shown as a single connection 134 and 199, the control signals may originate from the DSP 124 and/or from the microprocessor 118, and are supplied to a variety of points within the RF subsystem 144. It should be noted that, for brevity, only the basic components of the portable transceiver 100 are illustrated herein.

The baseband subsystem 130 also includes, in one embodiment, a digital-to-analog converter (DAC) 136. The DAC 136 also communicates with the microprocessor 118, memory 120, analog circuitry 122, and/or DSP 124 via bus 128. The DAC 136 converts the digital communication information within the baseband subsystem 130 into an analog signal for transmission to the RF subsystem 144 via connection 142.

The analog signal on connection 142 is modulated and converted at a modulator 148, in cooperation with one or more components of the receiver system 201 (via connection 166). A modulated signal provided by the modulator 148 is provided over connection 154. A power amplifier system (PAS) 180 amplifies the modulated signal(s) on connection 154 to the appropriate power level for transmission via connection 162 to a duplexer and/or switch module 174. The transmit signal energy is provided from the duplexer and/or switch module 174 to an antenna 172.

Signals are received at the antenna 172, provided to the duplexer and/or switch module 174, and routed to one of several signal-processing paths of the receiver system 201 via connection 173. It will be appreciated by one having ordinary skill in the art that in a full-duplex transceiver, such as that used in WCDMA, the simultaneous transmit/receive signal is accomplished, in one implementation, through the use of the duplexer and/or switch module 174. The duplexer and/or switch module 174 can include a duplexer to accommodate the full duplex transmission of WCDMA systems as well as include a multiple output switch/filter for other systems and/or standards incorporated in the receiver system 201. The duplexer and/or switch module 174 will typically route one set of bands to a first port (not shown), and a second set to a second port (not shown), thus acting as a three port device (e.g., the antenna port handling all frequencies, a receive port handling receive signals for provision to the receiver system 201, and a transmit port handling transmit frequencies). In one embodiment, the operation of the duplexer and/or switch module 174 is controlled by a control signal from the baseband subsystem 130 (e.g., via connection 134). In some embodiments, a switch (e.g., controlled from the baseband subsystem 130 via connection 134, for example) can be used to route received signals to the receiver system 201 or transmit signals from connection 162 to the antenna 172.

Signals received by the antenna 172 can, at the appropriate time determined by the baseband subsystem 130, be directed via the duplexer and/or switch module 174 to the receiver system 201 via connection 173. The receiver system 201 includes DC offset correction circuitry 240, which is a bandwidth-adjustable portion of the DC offset correction system 200 that provides DC offset correction. Additionally, the receiver system 201 includes a serial bus interface 192. The serial bus interface 192, in one embodiment, is also part of the DC offset correction system 200. The serial bus interface 192 can receive signal instructions from the DC offset control logic 119 via connection 199 (and bus 128) to route control signals to the DC offset correction circuitry 240 for changing time constants, among other functionality. Further, the receiver system 201 includes components used for receiving and processing (e.g., filtering, downconversion, amplification, demodulation, etc.) signals for the various modes and systems. The receiver system 201 provides output signals over connection 198 to the bus 128 for further processing in the digital domain.

FIG. 2A is a block diagram that illustrates an embodiment of the DC offset control circuitry 240a for an analog-baseband receiver 201a (receiver system 201a) of the portable transceiver 100 shown in FIG. 1. The receiver system 201a includes functionality for receiving and processing signals corresponding to several modes via connection 173. Connection 173 includes processing paths corresponding to the GSM and WCDMA modes of operation, although other modes of operation such as for CDMA can be implemented as well. The path starting at connection 251 from the duplexer and/or switch module 174 corresponds to a signal-processing path for the WCDMA mode. The path starting at connection 253 represents a signal-processing path corresponding to the GSM mode. A baseband section 212a includes an architecture that provides baseband signal-processing of signals from the WCDMA signal-processing path. A baseband section 212b, of similar architecture to the baseband section 212a, provides baseband signal processing of signals from the GSM signal processing path.

With reference to the WCDMA signal-processing path, the signal received from the duplexer and/or switch module 174 is provided over connection 251 to a duplexer 202. The duplexer 202 filters the received signal and supplies the filtered signal on connection 203 to a WCDMA low noise amplifier (LNA) 204. The duplexer 202 can be a bandpass filter, which passes all channels of the particular cellular system in which the portable transceiver 100 (FIG. 1) is operating. One purpose of the duplexer 202 is to reject all frequencies outside the desired frequency region. The WCDMA LNA 204 amplifies the signal on connection 203 using amplifiers 206a and/or 206b, and provides the amplified signal over connection 205 to a WCDMA Surface Acoustic Wave (SAW) filter 208. The WCDMA SAW filter 208 rejects unwanted signals (e.g., transmitter signal leakage) and provides the filtered signal over connection 207 at a defined frequency to the downconverter 210 (labeled "mixer" in FIG. 2A).

The downconverter 210 receives a local oscillator (LO) signal from Phase-Locked Loop (PLL) element 290. The PLL element 290 can be integrated into the receiver system 201a, or in some embodiments, can be a separate component. In one embodiment, the PLL element 290 includes an oscillator 246, divide-by-N module 248 (where N is an integer number that is adjusted depending on the different channel numbers for the different systems), loop filter 250, and reference crystal oscillator 252. Within each standard such as WCDMA or GSM, N varies depending on the channel number. N can also be a fractional number (e.g., non-integer) depending on the system requirements corresponding to different standards. Thus, the value of N can change in a given system or mode to tune across different channels. The PLL element 290 signal instructs the downconverter 210 via connection 243 as to the proper frequency to which to downconvert the signal received from the WCDMA SAW filter 208. The signal on connection 207 is thus downconverted to baseband on connection 209 (carrying the "I" signal) and 221 (carrying the "Q" signal).

The baseband section 212a includes components for filtering, DC offset correction, and amplification of the "I" and "Q" signals. As the path for "I" and "Q" signals includes similar components, for brevity, discussion will focus on components along the "I" path. The "I" path of the baseband section 212a includes a low-pass (LP) filter 214, an all-pass (AP) filter 226, DC offset correction circuitry 240a comprising a DC offset loop 232, and an automatic gain control (AGC) element 216.

The "I" baseband signal on connection 209 corresponding to the downconverted WCDMA signal is filtered by LP filter 214, and provided over connection 211 to automatic gain control (AGC) element 216. The AGC element 216 includes variable-gain amplifiers (VGAs) 218 and 222 and a low-pass (LP) filter 220. The "I" signal is amplified and low-pass filtered, and the processed "I" signal is provided on connection 217.

The processed "I" signal on connection 217 undergoes DC offset correction via the DC offset correction circuitry 240a. The DC offset correction circuitry 240a includes a DC offset loop 232 that has a switchable bandwidth. In one embodiment, the DC offset correction control logic 119 (FIG. 1) sends control signals via the serial bus interface 192 (FIG. 1) to the DC offset correction circuitry 240a. The control signals sent by the DC offset correction control logic 119 effect changes in resistance and/or capacitance values of the DC offset loop 232, as explained below, based on the desired bandwidth (e.g., the desired bandwidth based on the implemented mode). The implemented mode can be, for example, GSM, WCDMA, sleep-mode, idle-mode, etc. The DC offset corrected "I" signal is subject to filtering at AP filter 226, and the filtered signal is provided over connection 198 to the baseband subsystem 130 (FIG. 1) for further signal-processing. The signal(s) on connection 198 can be provided to an analog-to-digital converter (ADC) (not shown) in the baseband subsystem 130 (FIG. 1). The ADC can provide the converted signal to other components of the baseband subsystem 130 via the bus 128. For example, the signal can be digitized (e.g., at the ADC) and provided to the DSP 124 (FIG. 1), microprocessor 118 (FIG. 1), or a modem (not shown), etc., depending on the application.

GSM signals are received at the GSM LNA 256 from the duplexer and/or switch module 174 over connection 253. The GSM LNA 256 includes amplifiers 258a and 258b. The selected GSM signals are provided over connection 257 to the GSM downconverter 262, where it is downconverted to baseband under the control of PLL element 290 via connection 243. The baseband signals are provided over connections 261 and 265 to the baseband section 212b for processing in similar manner to that described above. DC offset correction circuitry in the baseband section 212b is likewise bandwidth adjusted corresponding to the mode selected, as described above.

When the portable transceiver 100 (FIG. 1) alternates between sleep and idle modes, the different circuit elements undergo a warm-up period followed by a settling period, the settling period ending before the portable transceiver 100 actually begins to demodulate the received signal. Therefore, the DC offset correction system 200 (FIG. 1) provides a speed-up technique where the time constant of the DC offset correction circuitry 240a is switched during a sleep mode before commencing an idle mode to speed-up settling of the loops. The idle mode and sleep mode are activated in an alternating sequence according to predefined timing sequences dictated, in whole or in part, by the various standards, such as WCDMA and CDMA 2000. For example, in CDMA 2000, the idle time is approximately 80 milliseconds and the sleep time is controlled by a parameter referred to as a "slot-cycle index" (SCI). When the SCI is 0, then the sleep time is approximately 1.28 seconds. When the SCI is 1, the sleep time is approximately 2.56 seconds, and so on. Therefore, the portable transceiver 100 (FIG. 1), having programmed within the precise timing information, starts powering on components of the DC offset correction circuitry 240a of the receiver system 201 (FIG. 1) before the start of the 80 millisecond idle time (e.g., during sleep mode). It is during the sleep mode that the DC offset correction circuitry bandwidth is switched to a higher value to enable faster settling. The bandwidth is switched back upon settling of the DC offset correction circuitry 240a. The settling time is calculated (e.g., by the DC offset correction control logic 119) based on the loop bandwidth of the DC offset correction circuitry 240a that is switched, which may additionally include a predetermined amount of margin. The DC offset correction control logic 119 (or other baseband subsystem component) assumes that settling has been completed based on this calculated settling time (with or without the defined margin), and responsively, signals the DC offset correction circuitry to reduce the bandwidth. This technique in effect increases the bandwidth of the DC offset correction loops 240a, which can result in an increased loss of signal energy. However, if switching to an increased bandwidth is limited to these sleep mode-to-idle mode cycles, and the DC offset correction circuitry 240a is maintained at normal operating bandwidth otherwise, an overall negligible effect on signal integrity results.

The DC offset correction circuitry cut-off frequency is adjusted by switching an equivalent capacitance value and/or a resistance value of the DC offset loop 232. FIG. 2B is a schematic diagram of an embodiment of a DC offset correction system 200a for the analog baseband receiver 201a of FIG. 2A. The DC offset correction system 200a includes the DC offset correction control logic 119, the DC offset correction circuitry 240a, and the serial bus interface 192, where control signals from the DC offset correction control logic 119 (FIG. 1) are routed. Alternatively, control signals can be provided under hardware control over connection 134 from the DC offset correction control logic 119 to the DC offset correction circuitry 240a through the use of, for example, a dedicated pin (not shown) in the receiver system chip.

The DC offset correction circuitry 240a includes, in one embodiment, a DC offset loop 232 comprising a summer element 239, amplifiers 241 and 247, a resistor 245 and a capacitor 249. In general, a signal on connection 217 represents the desired signal plus DC offset. The DC offset loop 232 is closed on connection 254 at the summer element 239, where the signal amplified by amplifier 241 is fed back to remove the DC offset from connection 217. The amplifier 241 amplifies the signal, which is then provided across the resistor 245 and the capacitor 249, which is configured with amplifier 247 as an integrator with a time constant determined by C×R (e.g., equivalent resistance of capacitor 249 multiplied by equivalent resistance of resistor 245). A lower time constant would increase the bandwidth (proportional to $1/(C \times R)$) and improve settling time, whereas a higher time constant would reduce the bandwidth and result in longer settling times.

The DC offset correction circuitry 240a also includes a capacitive switching network 255. The capacitive switching network 255 having, in one embodiment, parallel-configured capacitors $C_1$, $C_2$, $C_3$, and $C_4$, receives control signals from the DC offset correction control logic 119 to alter the equivalent capacitance value of capacitor 249. Note that greater or fewer capacitors can be used in the capacitive switching network 255, or in some embodiments, the capacitive switching network 255 may be omitted and a resistive switching network, similarly configured and controlled to alter the equivalent resistance of resistor 245, may be used. Further, in some embodiments, a combination of a resistive switching network and the capacitive switching network 255 may be used. Some embodiments may omit the capacitive switching network (or a similarly configured resistive switching network), and replace capacitor 249 and/or resistor 245 with a variable capacitor and/or resistor, respectively. Such a variable capacitor or variable resistor can be configured to receive control signals from the DC offset correction control logic 1.19. Since the DC offset loop 232 acts as a low pass filter, the cut-off frequency is essentially determined by $1/[2 \times (\pi \times R \times (C+C_1+C_2+C_3+C_4))$. Hence, the equivalent capacitance value of capacitor 249 (and/or resistor 245 in similar manner in some embodiments) can be switched in value to change the cut-off frequency and hence the settling time.

In one embodiment, when the DC offset correction control logic 119 receives an indication of a mode change or a mode command signal from which the DC offset correction control logic 119 can infer a mode change (e.g., receives a sleep mode command), the DC offset correction control logic 119 can provide a 2-bit binary number (control signal) to the capacitive switching network 255 via the serial bus interface 192. Alternatively, the DC offset correction control logic 119 can send control signals over connection 134. As described above, internal programming in the baseband subsystem components, such as in the DC offset correction control logic 119, "knows" when the idle mode will commence according to a prescribed standard. Thus, upon receiving the sleep mode command (or indication of mode change), the DC offset correction control logic 119 may signal instruct the DC offset correction circuitry 240a either immediately or after a prescribed delay to account for timing between mode changes.

The control signal can switch the capacitors ($C_1$, $C_2$, $C_3$, and/or $C_4$) on or off depending on the desired cut-off frequency. For example, the cut-off frequency can be switched by altering the total capacitance value from $C+C_1+C_2$ to $C+C_1+C_2+C_3$. Thus, using the example of the change from the sleep mode to the idle mode, a sleep mode command can be received by the DC offset correction control logic 119. Responsively, the DC offset correction control logic 119 can send (with or without a prescribed delay according to the standard implemented) a control signal to the capacitive switching network 255 to lower the equivalent capacitance value of capacitor 249, resulting in a shorter time constant dictated by the resistive/capacitive elements that speeds-up the response (greater bandwidth and thus larger cut-off frequency) of the DC offset loop 232. The DC offset correction control logic 119 can then send a signal to the capacitive switching network 255 to increase the equivalent capacitance of the capacitor 249, thus providing a longer time constant (and smaller bandwidth and thus smaller cut-off frequency) to return to normal operation. The DC offset correction control logic 119 can send the latter signal after a predetermined time based on the settling time of the DC offset control circuitry 240a.

In some embodiments, functionality of the DC offset correction control logic 119 can reside in the receiver system 201a (FIG. 2A). For example, when the receiver system 201a alternates between different modes (e.g., between sleep and idle modes), this mode change information can be used by similar logic residing in the receiver system 201a to change the cut-off frequency of the DC offset control circuitry 240a.

FIG. 3A is a block diagram illustrating an embodiment of portions of the DC offset correction system 200 (FIG. 1) for a digital baseband receiver (receiver system 201b) of the portable transceiver 100 shown in FIG. 1. The components corresponding to the signal-processing paths up-stream of, and including, the downconverters for the WCDMA and GSM signal-processing paths are the same or substantially similar to that described for the receiver system 201a of FIG. 2A, and thus the corresponding explanation will be omitted for brevity. "I" and "Q" baseband signals from the downconverters corresponding to the WCDMA and GSM signal-processing paths are provided to baseband subsections 312a and 312b, respectively. With emphasis on the "I" signal path for brevity, the baseband subsection 312a includes low-pass (LP) filter 314, VGA 316, DC offset correction circuitry 240b, analog-to-digital converter (ADC) 320 (e.g., sigma delta converter), and decimator filter 322 (represented by a downward arrow followed by an upper-case M). The baseband section 312a also includes finite-impulse response (FIR) filter 324, digital to analog converter (DAC) 328, and smoothing filter (SF) 330. The DC offset correction circuitry 240b includes DC offset loop 232 as described above, and a high-pass filter (HPF) 327. The DC offset loop 232 and the high-pass filter 327 are bandwidth adjusted (e.g., have switchable bandwidths) to achieve the desired settling time, as described below. The baseband section 312b has a similar structure and function, and thus the discussion of the same will be omitted.

Processing of the "I" signal will be described, with the understanding that a similar explanation for processing of the "Q" signal applies. The "I" signal on connection 311 is filtered at the LP filter 314 and provided on connection 301. The filtered signal provided on connection 301 is amplified by the VGA 316, and provided on connection 303. Note that the functionality of the VGA 316 can be performed post-decimation in some embodiments, and/or the functionality can be integrated into the ADCs (e.g., ADC 320) in some embodiments. The amplified signal on connection 303 undergoes DC offset correction at the DC offset loop 232 in a manner as described in association with FIG. 2B. The DC corrected signal is provided to the ADC 320, where it is sampled corresponding to the sampling rate designated by one or more components of the baseband subsystem 130 (FIG. 1, for example, the DSP 124).

The sampled signal is then provided on connection 305 and processed (e.g., convert the output of the ADC 320 to a lower rate before feeding the FIR filter 324) at the decimator filter 322. The decimation that is provided by the decimator filter 322 is an operation of downsampling from a higher frequency to a lower frequency, which can be implemented as an integer rate conversion or a non-integer rate conversion. The downsampled value from the decimator filter 322 is provided over connection 307 to the FIR filter 324. The filtered signal is provided over connection 309 to the high-pass filter 327, which has an adjustable cut-off frequency via control input from the DC offset correction control logic 119 (FIG. 1). The high-pass filter 327 provides a filtered signal over connection 310 to the DAC 328, where it is converted to an analog signal and provided over connection 313 to the smoothing filter 330. At the smoothing filter 330, the signal is further filtered (e.g., removing alias spurs created by the sample and hold operation performed by the DAC 328). The output signal of the smoothing filter 330 is then provided over connection 198 to the baseband subsystem 130 (FIG. 1).

FIG. 3B is a block diagram that illustrates an embodiment of a DC offset correction system 200b for the digital baseband receiver 201b of FIG. 3A. The DC offset correction system 200b is shown using the WCDMA system components on the "I" branch, with the understanding that similar DC offset correction circuitry is used for the "Q" branch of the WCDMA baseband section 312a (FIG. 3A) as well as for the "I" and "Q" branches of the GSM baseband section 312b (FIG. 3A). As shown in FIG. 3B, the DC offset correction system 200b includes the DC offset correction control logic 119, the serial bus interface 192, and the DC offset correction circuitry 240b, which comprises the high-pass filter (HPF) 327 and the DC offset loop 232. The DC offset correction circuitry 240b includes a combination analog and digital domain approach. The high-pass filter 327 removes DC from the system. The cut-off frequency of the high-pass filter 327, as determined by the DC offset correction logic 119, determines the settling time of the high-pass filter 327. For example, if the cut-off frequency is doubled, the settling time reduces to half the original value. The high-pass filter 327 may itself be implemented digitally. For example, the high-pass filter 327 has a cut-off frequency that can be switched by switching the coefficients of the high-pass filter 327. These coefficients can be programmed either through the serial bus interface 192 from the DC offset correction control logic 119 or connection 134. Alternatively, a set of coefficients corresponding to normal and fast settling (e.g., 2×, 4×, 8×, etc.) can be stored in the receiver system 201b, and speed selection can reside in the DC offset correction control logic 119 residing in the baseband subsystem 130 (FIG. 1). The DC offset loop 232, implemented using an analog approach, is bandwidth-adjusted in a manner as described in association with FIG. 2B.

Thus, for the DC offset correction system 200b, total DC offset correction is implemented using an analog approach (the DC offset loop 232) and a digital approach (the high-pass filter 327). Cut-off frequency for each portion can be adjusted individually and in conjunction with each other. The cut-off frequency information can be provided by the DC offset correction control logic 119 in response to an indication of mode or mode change, as described above. The DC offset correction control logic 119 can operate through the serial bus interface 192 or without the serial bus interface 192 via control connection 134. In some embodiments, functionality of the DC offset correction control logic 119 can reside in the receiver system 201 (FIG. 1) or other RF subsystem components, and be triggered in response to changes from a sleep to idle mode (or vice versa) communicated by the baseband subsystem 130 (FIG. 1). Similarly, changes from CDMA or WCDMA to GSM modes of operation can be communicated to the DC offset correction control logic 119 residing in the baseband subsystem 130 (FIG. 1), or similar functionality residing in the receiver system 201 of the RF subsystem 144 (FIG. 1) or in another RF subsystem component.

FIG. 4 is a schematic diagram that illustrates an example timing sequence for a sleep-to-idle mode warm-up and settling period acted upon by the DC offset correction system embodiments 200a, 200b shown in FIGS. 2B and 3B. With continued reference to FIGS. 2A–3B, shown are enable lines 470, 472, 474, 476 corresponding to the power-up sequence of the reference crystal oscillator 252 the balance of the components of the PLL element 290, the receiver system 201a, 201b (components of the receiver system 201a, 201b minus the DC offset correction circuitry 240a, 240b and assuming the PLL element 290 and reference crystal oscillator 252 are not integrated into the receiver system 201a, 201b), and the DC offset correction circuitry 240a, 240b, respectively. The enable line 476 is shown starting in the sleep mode (at start point 479), although as explained below, it also provides an indication (start point 477) of where the power-up of conventional DC offset correction circuitry would begin (e.g., no bandwidth adjustment and if started in the idle mode). Durations between power-ups (includes warm-up and settle-time) are represented by upper case letters A–D. Accordingly, the duration of time between the power-up of the oscillator 252 and the PLL element 290 is represented by "A," and delineated by start-up times at times 471 and 473. Similarly, the duration between the power-up of the PLL element 290 and the receiver system 201a, 201b is represented by "B," and delineated by start-up times at times 473 and 475.

Likewise, the duration between the power-up of the receiver system 201a, 201b (less DC offset correction circuitry 240a, 240b) at start time 475 and conventional DC offset correction circuitry at 477 is represented by "C." Start time 479 represents DC offset correction circuitry start-up during the sleep mode, and thus duration "D" represents the warm up-and settle-time for the DC offset correction circuitry 240a, 240b when commenced in the sleep mode, which, with the bandwidth change, can be less than 100 microseconds. Some exemplary duration times are 2–3 msec (milliseconds) for "A," 1–2 msec for "B," and 1–2 msec for "C." A shorter warm-up time is beneficial to the portable transceiver 100 (FIG. 1) because the amount of time that the different circuit blocks are active is actually reduced, thereby minimizing current draw. A smaller current draw, in turn, helps increase the standby time of the portable transceiver 100. Starting at time 479 and increasing the bandwidth of the DC offset correction circuitry 240a, 240b reduces the time required to warm-up the receiver before actual data demodulation begins, and thus actual data demodulation can begin immediately after the VCO and PLL are settled (e.g., at starting point 473). Otherwise, data demodulation would be delayed until time 477.

FIG. 5 is a schematic diagram that illustrates an example timing sequence for a change-over from a compressed mode of operation acted upon by the DC offset correction system embodiments shown in FIGS. 2B and 3B. WCDMA enable line 502 comprises a high signal level and a low signal level. For example, point 506 corresponds to a low signal level, resulting in the cessation of the WCDMA mode for a period starting at point 506 and ending at point 508. At timing point 508, the WCDMA enable line 502 goes to a high signal level, resulting in the re-commencement of the WCDMA mode. The low-level signal delineated by points 506 and 508 represents a "gap" created in the WCDMA frames to enable the portable transceiver 100 (FIG. 1) to make GSM measurements, as described above.

GSM enable line 504 also comprises a high signal level and low signal level. For instance, at point 510, the GSM enable line goes to a high signal level and thus commences the compressed mode where various measurements of the WCDMA system are taken. At point 512, the GSM enable line goes to a low signal level corresponding to the cessation of the compressed mode. In some embodiments, the duration (represented by "D") of the compressed mode may be approximately 200 microseconds. The period of time designated by point 512 and point 514 (the duration represented by "E") represents the time required for WCDMA settling which includes the DC offset correction settling time. In other words, during the period of time "D," the DC offset correction circuitry bandwidth is switched to reduce the settling time.

In light of the above description, reference is directed to FIG. 6, where it is illustrated and apparent that one embodiment of an example methodology employed by the DC offset correction logic 119 (FIG. 1) includes detecting a change in mode of operation of a portable transceiver 100 (FIG. 1) (step 602); responsive to the detection, sending a first signal to effect a change in DC offset correction circuitry 240 (FIG. 1) from a first bandwidth to a second bandwidth to speed up settling time of the DC offset correction circuitry 240 (step 604); and sending a second signal to effect a return to the first bandwidth in the DC offset correction circuitry (step 606).

Any process descriptions or blocks in the flow charts of FIG. 6 should be understood as representing modules, segments, or portions of code which include one or more executable instructions for implementing specific logical functions or steps in the process, and alternate implementations are included within the scope of the preferred embodiment of the present invention in which functions may be executed out of order from that shown or discussed, including substantially concurrently or in reverse order, depending on the functionality involved, as would be understood by those reasonably skilled in the art of the present invention.

While various embodiments have been described, it will be apparent to those of ordinary skill in the art that many more embodiments and implementations are possible that are within the scope of the described systems and methods.

What is claimed is:

1. A direct current offset correction system, comprising:
   direct current offset correction circuitry having an adjustable bandwidth; and
   control logic configured to effect a bandwidth change of the direct current offset correction circuitry by effecting an increase in the bandwidth during a sleep mode of operation that precedes an idle mode of operation, said bandwidth change expediting at least one of a warm-up and settling time of the direct current offset correction circuitry.

2. The system of claim 1, wherein the direct current offset correction circuitry includes a switching network in communication with the control logic, said direct current offset correction circuitry including at least one of a low-pass filter having a first resistor and a first capacitor and a digital high pass filter.

3. The system of claim 2, wherein the switching network includes at least one of a second capacitor and a second resistor.

4. The system of claim 3, wherein the switching network, responsive to a signal from the control logic, enables the second capacitor to change an equivalent capacitance of the first capacitor, said change in equivalent capacitance effecting the bandwidth change.

5. The system of claim 3, wherein the switching network, responsive to a signal from the control logic, enables the second resistor to change an equivalent resistance of the first resistor, said change in equivalent resistance effecting the bandwidth change.

6. The system of claim 3, wherein the switching network, responsive to a signal from the control logic, enables the second resistor to change an equivalent resistance of the first resistor and the second capacitor to change an equivalent capacitance of the first capacitor, said change in equivalent capacitance and equivalent resistance effecting the bandwidth change.

7. The system of claim 3, wherein the digital high-pass filter, responsive to a signal from the control logic providing response speed information, includes filter coefficients that are selected based on the signal from the control logic to alter the bandwidth of the digital high-pass filter.

8. The system of claim 3, wherein the digital high-pass filter, responsive to a signal from the control logic providing one of a plurality of filter coefficients, alters the bandwidth of the digital high-pass filter.

9. The system of claim 1, further including a serial bus interface disposed between the control logic and the direct current offset correction circuitry.

10. The system of claim 1, wherein the control logic resides in at least one of a processor, memory, and a receiver system that includes the direct current offset correction circuitry.

11. The system of claim 1, wherein the control logic is configured to effect a bandwidth change of the direct current offset correction circuitry in response to detecting a change in mode of operation.

12. The system of claim 1, wherein the control logic is configured to effect a bandwidth change of the direct current offset correction circuitry in response to receiving a mode command.

13. The system of claim 1, wherein the control logic is configured to effect a bandwidth change of the direct current offset correction circuitry by effecting a decrease in the bandwidth when settling of the direct current offset correction circuitry is complete.

14. The system of claim 1, wherein the control logic is further configured to effect a bandwidth change of the direct current offset correction circuitry by effecting an increase in the bandwidth during a compressed mode of operation, said bandwidth change expediting at least one of a warm-up and settling time of the direct current offset correction circuitry.

15. The system of claim 14, wherein the control logic is configured to effect a bandwidth change of the direct current offset correction circuitry by effecting a decrease in the bandwidth when settling of the direct current offset correction circuitry is complete.

16. The system of claim 1, wherein the direct current offset correction circuitry includes at least one of a variable resistor and a variable capacitor.

17. The system of claim 16, wherein the variable resistor, responsive to a signal from the control logic, changes resistance to effect the bandwidth change.

18. The system of claim 17, wherein the variable capacitor, responsive to a signal from the control logic, changes capacitance to effect the bandwidth change.

19. The system of claim 16, wherein the variable capacitor, responsive to a signal from the control logic, changes capacitance to effect the bandwidth change.

20. A direct current offset correction system, comprising:
    means for providing direct current offset correction; and
    means for changing the bandwidth of the direct current offset correction means by effecting an increase in the bandwidth during a compressed mode of operation, said bandwidth change expediting at least one of a warm-up and settling time of the direct current offset correction circuitry.

21. The system of claim 20, wherein the means for changing the bandwidth is responsive to means for detecting a change in mode of operation.

22. The system of claim 20, wherein the means for changing the bandwidth is responsive to means for receiving a mode of operation command.

23. A method of operating a direct current offset correction system, comprising:
    providing direct current offset correction circuitry that is configured with an adjustable bandwidth; and
    changing the bandwidth of the direct current offset correction circuitry by effecting an increase in the bandwidth during a sleep mode of operation that precedes an idle mode of operation, said bandwidth change expediting at least one of a warm-up and settling time of the direct current offset correction circuitry.

24. The method of claim 23, wherein changing the bandwidth includes changing at least one of an equivalent capacitance of the direct current offset correction circuitry and an equivalent resistance of the direct current offset correction circuitry.

25. The method of claim 23, wherein changing the bandwidth includes changing a digital high-pass filter bandwidth.

26. The method of claim 25, wherein changing a digital high-pass filter bandwidth includes changing filter coefficient values of the digital high-pass filter.

27. The method of claim 23, wherein changing the bandwidth is responsive to at least one of detecting a change in mode of operation and receiving a mode command.

28. A method of operating a direct current offset correction system, comprising:

providing direct current offset correction circuitry that is configured with an adjustable bandwidth; and changing the bandwidth of the direct current offset correction circuitry by effecting an increase in the bandwidth during a compressed mode of operation, said bandwidth change expediting at least one of a warm-up and settling time of the direct current offset correction circuitry.

29. The system of claim 20, wherein the means for changing the bandwidth further comprises:

means for effecting a bandwidth change of the direct current offset correction means by effecting an increase in the bandwidth during a sleep mode of operation that precedes an idle mode of operation, said bandwidth change expediting at least one of a warm-up and settling time of the direct current offset correction circuitry.

* * * * *

UNITED STATES PATENT AND TRADEMARK OFFICE
CERTIFICATE OF CORRECTION

PATENT NO. : 7,231,193 B2  Page 1 of 1
APPLICATION NO. : 10/822919
DATED : June 12, 2007
INVENTOR(S) : Ramachandran et al.

It is certified that error appears in the above-identified patent and that said Letters Patent is hereby corrected as shown below:

Col. 14, line 62, after "changing" delete "a".

Signed and Sealed this

Eighteenth Day of September, 2007

JON W. DUDAS
*Director of the United States Patent and Trademark Office*

UNITED STATES PATENT AND TRADEMARK OFFICE
CERTIFICATE OF CORRECTION

PATENT NO. : 7,231,193 B2  
APPLICATION NO. : 10/822919  
DATED : June 12, 2007  
INVENTOR(S) : Ramachandran et al.

Page 1 of 1

It is certified that error appears in the above-identified patent and that said Letters Patent is hereby corrected as shown below:

Col. 14, line 62, after "changing" add --the--.

Signed and Sealed this

Eighth Day of July, 2008

JON W. DUDAS  
*Director of the United States Patent and Trademark Office*